United States Patent [19]

Armstrong

[11] 4,312,896

[45] Jan. 26, 1982

[54] NOVEL SOLDERING PROCESS COMPRISING COATING A DIELECTRIC SUBSTRATE WITH ELECTROCONDUCTIVE METAL PROTECTED BY NICKEL CARBIDE

[75] Inventor: Harris W. Armstrong, Ft. Worth, Tex.

[73] Assignee: Graham Magnetics, Inc., North Richland Hills, Tex.

[21] Appl. No.: 126,396

[22] Filed: Mar. 3, 1980

Related U.S. Application Data

[60] Division of Ser. No. 931,861, Aug. 7, 1978, which is a continuation-in-part of Ser. No. 697,940, Jun. 21, 1976, abandoned.

[51] Int. Cl.$^3$ ............................................. H05K 3/12
[52] U.S. Cl. ........................................ 427/96; 29/843; 29/846; 228/180 R; 427/190; 427/191; 427/199; 427/216; 427/226; 427/229; 427/376.3; 427/376.7; 427/376.6; 427/383.5
[58] Field of Search ............. 29/843, 846; 228/180 R; 427/96, 199, 190, 191, 216, 226, 228, 229, 376.3, 376.6, 376.7, 383.5; 252/513, 516, 519

[56] References Cited

U.S. PATENT DOCUMENTS

| | | | |
|---|---|---|---|
| 3,943,168 | 3/1976 | Patterson | 252/519 |
| 4,079,156 | 3/1978 | Youtsey et al. | 427/96 |
| 4,084,314 | 4/1978 | Chakrabarty | 29/843 |
| 4,092,459 | 5/1978 | Deffeyes et al. | 427/215 |
| 4,130,854 | 12/1978 | Hertz | 427/191 |

Primary Examiner—John D. Smith
Attorney, Agent, or Firm—Robert A. Cesari; John F. McKenna; Andrew F. Kehoe

[57] ABSTRACT

A novel process for fastening ceramic material such as alumina or the like to metallic material such as an electrical conductor. The process is characterized by the fact that a solder wettable, oxidation-resistant barrier is used, on metal particles printed onto the ceramic. In some advantageous processes, the carbide layer allows metallizing processes to be carried out in non-hydrogen atmospheres. The process requires no expensive noble metal; and it utilizes a barrier material which is sufficiently stable to tolerate conductive film formation at high temperatures. Nickel-carbide coated nickel is a particularly favorable material for use in the invention because it is conductive, in the ohmic sense, and is readily wetted by common solders.

Also disclosed are novel articles and compositions useful in practice of the process of the invention, and novel articles produced by the process of the invention.

15 Claims, 4 Drawing Figures

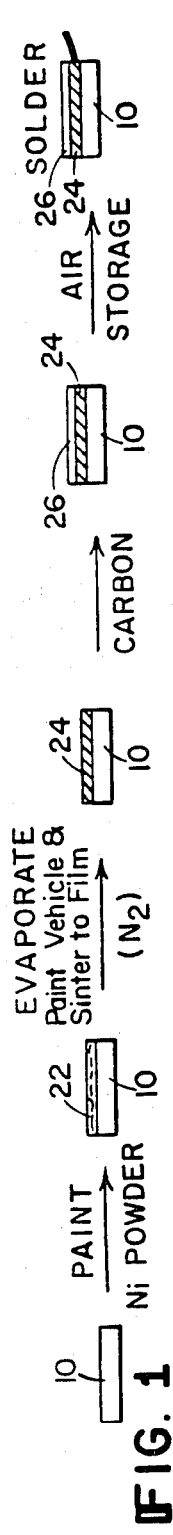
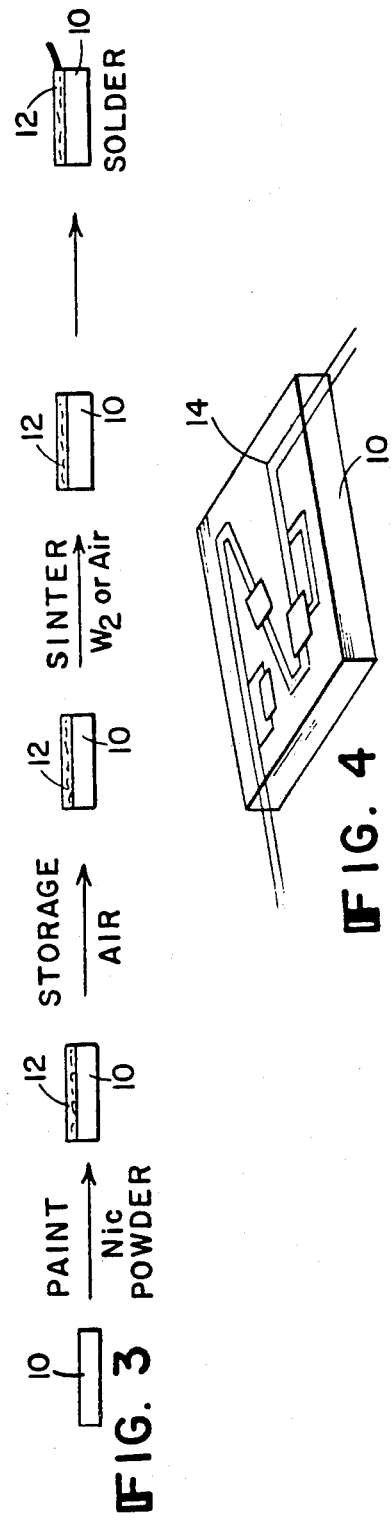

NOVEL SOLDERING PROCESS COMPRISING COATING A DIELECTRIC SUBSTRATE WITH ELECTROCONDUCTIVE METAL PROTECTED BY NICKEL CARBIDE

RELATED APPLICATION

This is a division of application Ser. No. 931,861, filed Aug. 7, 1978, which was a continuation-in-part of application, Ser. No. 697,940, filed on June 21, 1976, now abandoned by Harris W. Armstrong and entitled Soldering Process and Articles for Use Therein.

BACKGROUND OF THE INVENTION

This invention relates to a novel process for metallizing ceramic surfaces, as with a conductor pattern, in such a way as to be able to form reliable seals between a conductive metallic pattern to be developed on a ceramic material and metal leads therefrom.

There are a number of problems associated with the ceramic-metallizing processes, and the ceramic to metal bonding process, of the prior art. Generally, the processes require (a) use of noble metals or (b) use of a hydrogen atmosphere for processing of relatively base materials like nickel. The noble metals are extremely expensive, but the use of nickel and hydrogen presents hazards which require expensive safety precautions. Moreover, nickel and other such metals tend to form oxides on storage which are not readily wetted by solder and which interfere with subsequent soldering. Also, some of the non-noble metals such as copper tend to migrate excessively ("plate out") during processing, storage or use.

Also, it is to be recognized that noble metals provide real problems when utilized in manufacture of components intended for high voltage applications. Silver conductors, so used, often have some silver metal migrate completely out of the primary conductor path in the form of discrete metal or in the form of whiskers. Similar problems are faced with such metals as gold, cadmium, and like metals which have little bonding force between atoms within the metal lattice. Thus, it would be desirable to provide a solderable conductive coating which does not require such metals. As mentioned above, base metals like nickel have required hydrogen firing, to achieve the desired sintering, once painted on a ceramic surface. Even then, they usually must be soldered immediately, or carefully stored in a non-oxidizing atmosphere, to avoid the formation of oxides which will interfere with the reliable formation of a good bond between the metallized coating on the ceramic and the conductor leading from the ceramic. Indeed, presence of such oxides usually requires the use of acid fluxes which are considered to be inconvenient and otherwise undesirable for many electronic applications.

Another problem encountered in present methods of metallizing ceramic surfaces is the so-called "solder-leaching" problem. This relates to a phenomena wherein silver in a lead is leached therefrom when the lead is dipped into a solder pot. Normally, this effect is minimized by adding about 2% to 5% silver to the solder; but, even with this expedient, the properties of silver conductors remain sensitive to dwell time within the solder pot.

It is already known in the art to provide metallizing paints for use on ceramic substrates such as alumina, silica, and the like. For example, U.S. Pat. No. 3,590,468 to Buck discloses a metallizing paint composition utilizing a glass frit, nitrocellulose and molybdenum trioxide or manganese dioxide to use in forming alumina-to-metal seals: The paint is first sintered and reduced to form a metal bearing coating; this process takes place at 1000° C. to 1500° C. in a wet hydrogen atmosphere. Apparently, a molybdenum or manganese film is formed during reduction. Normally more than one coat is applied to the ceramic substrate. Similar art is disclosed in U.S. Pat. No. 3,429,736 to Thompson et al; U.S. Pat. No. 3,347,704 to Meyer et al; and U.S. Pat. No. 3,403,043 to Thompson et al.

More recently, Patterson in U.S. Pat. No. 3,943,168, discloses particulate compositions which are formed of a special composition which is a combination of nickel borides and nickel silicides. This material, which is a solid solution, did not provide adequate oxidation resistance during firing. Some oxidation of $Ni_3B$ to $B_2O_3$ started as early in the firing cycle as 325° C. This drawback is recognized in subsequently-issued U.S. Pat. No. 4,064,310 to the same inventor.

In view of the increasing cost of using noble metals, in view of the unsuitability of these metals for many applications, (such as high voltage applications), and in view of the relatively expensive and inconvenient alternatives to their use, Applicant has turned his attention to providing improved processes and products which make entirely practical the metallizing of ceramic surfaces without resorting to use of noble metals and which enable one to minimize the use of special storage conditions and to avoid use of hydrogen gas in metallizing with non-noble metals.

SUMMARY OF THE INVENTION

The principal objects of the present invention are to provide metallized substrate articles, and processes for making such articles, bearing novel coatings, especially ceramic articles bearing electro-conductive coatings capable of being soldered to make a reliabe electro-conductive connection with conductors.

Another object of the invention is to provide such articles, and processes for making such articles, which do not require hydrogen, or even inert gases for their manufacture and do not require noble metals for their manufacture. Inert gases such as argon, nitrogen, xenon and the like are entirely suitable for most processes embodying the instant invention. Air can be used in those processes wherein the electro-conductive protective layer is maintained at all times on the metal.

A further object of the invention is to provide a metal bearing coating, readily solderable to form an electro-conductive connection and which can be stored for a long time under naturally occurring ambient atmospheres without becoming less reliably solderable.

Another object of the invention is to utilize a metal coating having the characteristics described in the foregoing paragraphs and which is resistant to "plating-out" and "migration" when incorporated into electrical circuits.

Another object of the invention is to provide a metallic paint that forms a conductive surface relatively insensitive to dwell time in a solder dip operation.

A further object of the invention is to provide an article having a good shelf life, bearing an exposed conductive surface formed of nickel or a conductive nickel compound, on a dielectric substrate and readily solderable to form a bond to a metallic lead.

Another object of the invention is to achieve materials and processes where sintering and firing steps can be carried out at relatively low temperatures.

The above objects, in their broadest aspect, have been substantially achieved by constructing an article having a dielectric substrate and a conductive coating thereon, which coating itself comprises, during at least one stage of its manufacture, a protective barrier material which resists the formation of oxide on the conductor. Nickel carbide on a nickel conductor is a good example of the invention, because nickel is an excellent solderable conductor and the carbide thereof has excellent barrier properties yet does not interfere with normal soldering procedures. Moreover, nickel carbide is conductive and, in some embodiments of the invention, can itself form a substantial part of the conductor portion of the metallized coating.

The products and processes of the invention can be formed, or used, in a number of ways. Some of these are illustrated as follows:

1. Sintering of a nickel bearing paste under an inert gas, e.g. nitrogen or argon, to form a nickel coating, which coating is subsequently provided with e.g. a nickel carbide coating to protect it.
2. Evaporation of liquid in air from a carbided-nickel bearing paint at temperatures, e.g. below 550° F., wherein the carbide is not destroyed. The conductive pattern formed by the nickel powder will be largely due to the particle-to-particle contact between the carbided-nickel powder. The carbide is thin, conductive, and does not interfere excessively with the conductive nature of the coating. Soldering of the carbided-nickel to a lead is readily accomplished in air.
3. Similar to (2) above, except that formation of a solid coating is achieved without substantial evaporation, e.g. by curing an epoxy or other resin matrix to form a coating wherein the carbided particles are in particle-to-particle contact.
4. Formation of a carbided-nickel coating which is storable, later sintered, under hydrogen or inert gas, e.g. nitrogen or argon, and then may or may not be re-carbided depending on whether or not the soldering action is to take place immediately after sintering or after a further storage period.

A particularly valuable process is one whereby a metallizing composition is formed to include, as its characteristic metal bearing component, a metal bearing powder wherein the metal is substantially protected by either (a) a protective coating of a chemically resistant material like a carbide or (b) is in the form of a chemical like a carbide which will reduce during a subsequent sintering step. The carbide is selected so that it protects the metal during evaporation, even in air, of a solvent. This step normally takes place at well under 500° F. The metal is not wholly sintered into a true film, but does form an adequate, dependable conduction.

As a consequence of this invention, a material like nickel powder can be carbided, formed into a metallizing paint, then formed into a conductive coating at a curing temperature of about 550° F. or less in air, and then soldered directly to an electro-conductive lead. On soldering, the nickel carbide does not interfere with the formation of a reliable article-to-lead metallic bond. The solder need contain no silver and can be other than a mineral-acid-containing solder.

The resultant conductive coating is relatively inexpensive in terms of both material cost and cost of processing. Moreover, it lacks the undesirable properties of copper and of such metals as silver.

All these advantages are achieved at essentially no cost in terms of desirable properties of the product.

The invention was made during work directed to metallizing the ceramic substrates commonly used in the electronics industry; i.e. in the manufacture of electronic components bearing painted conductive circuitry on dielectric substrates. However, it is to be realized that the processes and compositions of the invention are generally useful in forming seals between metal and ceramic surfaces, between two ceramic objects, or between two metal objects.

The preferred nickel-carbide decomposes to nickel at about 370° C. (700° F.). This is above the temperature of a solder bath. Other protective materials which can be wetted when matched to a suitable solder according to the present invention, include the silicides of nickel, cobalt and iron and the borides of nickel cobalt and iron. It is to be understood that it is most desirable that the protective barrier coating be a conductor. It should also be understood that alloys, comprising a major quantity of any of the metals mentioned above can be adequately protected according to the process of the invention.

The present invention is advantageous, not only in the temperature range in which it may be operated, but also in that it does not require the formation of solid solutions and allows minimumizing of the number of compounds and elements present in the reaction zones.

The invention can be implemented in a number of ways: The nickel carbide (or a like material) is advantageously used as a thin coating over the metal itself. This minimizes the amount of non-metallic material which is usually more expensive than the metal; however, it is also possible to have a paste containing particles which are entirely composed of a nickel carbide. Such particles will be most conductive if reduced during a sintering operation, or most appropriately, to a metal at a higher temperature soldering operation. Normally, however, such reduction requirements during the soldering operation will require a slowing down of the soldering line; consequently, carbide coated materials are most desirable.

ILLUSTRATIVE EXAMPLES OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

IN THE DRAWINGS

FIGS. 1 through 3 are schematic diagrams illustrating three different methods which utilize the protective barrier layer on a non-noble metal in bonding a metal conductor to a ceramic and, subsequently, attaching leads to said conductor.

FIG. 4 is a schematic diagram of a ceramic object bearing a carbided nickel conductive pattern thereon.

EXAMPLE 1

FIG. 2 illustrates a process whereby a ceramic wafer 10 is coated with a paste 12 formed of the following ingredients:

- 82.5 grams of a nickel carbide coated powder of about 2-5 microns in average particle diameter and sold under the trade designation Cobaloy 802 by the Cobaloy Company, of Arlington, Tex., a division of Graham Magnetics Incorporated;
- 2.5 grams of a glass frit composition sold under the tade designation SG-7 by the Owens-Illinois Company;
- 15.0 grams of an organic binder system of the type known to the art and sold under the trade designation "Squeegee Medium 163-C" by L. Reusche and Company, Newark, N.J.

The ingredients are mixed together by stirring and then further mixed on a three-mill roll. The nip of the rolls is set at a 0.025 inch gap, and the paste mixture is subject to at least about six passes.

A clean $Al_2O_3$ chip 10 (6% $Al_2O_3$ and, typically, of the type sold by Adolph Coors Company of Golden, Colo.) is prepared and a conductor pattern 14 (such as is shown on FIG. 4) is printed on the chip using paint 12. Thereupon, the chip is dryed at 100° C. for 30 minutes, fired at 900° C. in a firing chamber under $N_2$, for 15 minutes, cooled under $N_2$ and removed from the chamber with a conductive nickel coating 16.

The fired chip is dipped into a typical oxide removing flux sold under the trade designation Kester Flux 1544 by Kester Solder of Chicago, Ill. Thereupon the chip is processed according to the art in a typical solder formed of 62% tin, 37% lead. An excellent electro-conductive solder connection of the conductor pattern to leads from external circuitry is achieved. 1

EXAMPLE 2

In another embodiment of the invention, as shown in FIG. 1, a paste 22 is prepared from non-carbided nickel powder. The paste is fired at 900° C. for about 15 minutes in nitrogen to form a nickel film 24. Thereupon the nickel film is fired at 400° F. for about 60 minutes in a stream of carbon monoxide to provide it with a thin protective layer of nickel carbide 26. Thus, protected, the film remains solderable for a long period of time even though it is stored without taking precautions to protect it from normal environmental conditions of heat and humidity, e.g. conditions equivalent to 110° F. and 60% relative humidity.

EXAMPLE 3

Another paint compositon is prepared from:
- 80 grams of a carbide protected, 10 micron nickel flake sold under the trade designation Cobaloy 824 by the Cobaloy Company of Arlington, Tex., a division of Graham Magnetics Incorporated;
- 40 grams of methyl methacylate resin sold under the trade designation B-44 by Rohm and Haas Company;
- 30 grams of n-butylacetate.

The above listed ingredients are mixed and the resulting mix is painted on a glass slide and cured at 110° C. in air for one hour. A conductive film is formed and is found to be wettable by solder to form an excellent electro-conductive junction.

It is also to be understood that the following claims are intended to cover all of the generic and specific features of the invention herein described and all statements of the scope of the invention which might be said to fall therebetween.

What is claimed is:

1. In a process for making an electro-conductive connection between a conductive pattern on a dielectric substrate and another conductor, the improvement comprising the steps of
   (a) providing said dielectric substrate with a coating of electroconductive metal pattern, said metal bearing an electroconductive, oxidation-protective layer of nickel carbide barrier material;
   (b) decomposing said nickel carbide to provide new nickel surface area, and
   (c) soldering said conductive pattern to said other conductor.

2. A process as defined by claim 1 wherein heat for said decomposing is provided by solder applied at a temperature above the decomposition temperature of solder-wettable nickel carbide material.

3. A process as defined in claim 1 wherein said conductive pattern is formed of a fusible, glass-frit-containing composition.

4. A process as defined in claim 1, 2 or 3 wherein said nickel carbide barrier material is decomposed at a minimum temperature of about 370° C.

5. A process as defined in claim 4 wherein said nickel carbide is decomposed in air or in an inert gas.

6. A process as defined in claim 1, 2 or 3 wherein said nickel carbide barrier material is decomposed at a temperature of about 550° F. (287° C.).

7. A process as defined in claim 6 wherein said nickel carbide is decomposed in air or in an inert gas.

8. A process as defined in claims 1, 2 or 3 wherein said connecting is carried out in an inert gas.

9. A process as defined in claim 8 wherein said particles are sintered at a temperature of below about 550° F. and wherein said barrier layer material is decomposable at temperatures of about 700° C.

10. A process as defined in claims 1, 2 or 3 wherein said connecting is carried out in air.

11. A process as defined in claim 10 wherein said particles are sintered at a temperature of below about 550° F. and wherein said barrier layer material is decomposable at temperatures of about 700° C.

12. A process as defined in claims 1, 2 or 3 wherein said paint is substantially free of noble metals and copper.

13. A process as defined in claim 12 wherein said particles are sintered at a temperature of below about 550° F. and wherein said barrier layer material is decomposable at temperatures of about 700° C.

14. A process as defined in claim 13 comprising decomposing said particles to metal after the soldering step.

15. A process as defined in claim 1 wherein all steps of said process are carried out in air.

* * * * *